(12) United States Patent
Noguchi et al.

(10) Patent No.: US 10,592,163 B2
(45) Date of Patent: Mar. 17, 2020

(54) CONTROLLING WRITE PULSE WIDTH TO NON-VOLATILE MEMORY BASED ON FREE SPACE OF A STORAGE

(71) Applicant: TOSHIBA MEMORY CORPORATION, Tokyo (JP)

(72) Inventors: Hiroki Noguchi, Kanagawa (JP); Shinobu Fujita, Tokyo (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 15/455,387

(22) Filed: Mar. 10, 2017

(65) Prior Publication Data

US 2018/0081593 A1    Mar. 22, 2018

(30) Foreign Application Priority Data

Sep. 20, 2016    (JP) .................. 2016-183330

(51) Int. Cl.
*G06F 3/06*    (2006.01)
*G06F 13/16*    (2006.01)
*G11C 11/16*    (2006.01)

(52) U.S. Cl.
CPC .......... *G06F 3/0659* (2013.01); *G06F 3/0604* (2013.01); *G06F 3/0679* (2013.01); *G06F 13/161* (2013.01); *G11C 11/1673* (2013.01); *G11C 11/1677* (2013.01); *G11C 11/1675* (2013.01); *G11C 11/1693* (2013.01); *Y02D 10/14* (2018.01)

(58) Field of Classification Search
None
See application file for complete search history.

(56) References Cited

U.S. PATENT DOCUMENTS

| 5,576,996 A * | 11/1996 | Awaya ...................... G11C 7/22 365/189.12 |
| 7,057,922 B2 | 6/2006 | Fukumoto |
| 8,347,175 B2 | 1/2013 | Ikegawa et al. |
| 8,867,266 B2 | 10/2014 | Bessho et al. |
| 2008/0126690 A1 | 5/2008 | Rajan et al. |
| 2009/0116309 A1 | 5/2009 | Hanzawa et al. |
| 2015/0154125 A1* | 6/2015 | Ishii .................... G06F 11/1048 714/768 |
| 2015/0206567 A1* | 7/2015 | Bose .................... G11C 11/1675 365/158 |
| 2015/0206568 A1* | 7/2015 | Bose .................... G11C 11/1675 365/158 |
| 2015/0206569 A1* | 7/2015 | Bose ....................... A61H 3/00 365/158 |

FOREIGN PATENT DOCUMENTS

| JP | 2005-92912 | 4/2005 |
| JP | 2012-22726 | 2/2012 |
| JP | 5400262 | 1/2014 |
| JP | 5560944 | 7/2014 |

* cited by examiner

*Primary Examiner* — Jared I Rutz
*Assistant Examiner* — Marwan Ayash
(74) *Attorney, Agent, or Firm* — Oblon, McClelland, Maier & Neustadt, L.L.P.

(57) ABSTRACT

A memory system has a non-volatile memory, a storage accessible at higher speed than the non-volatile memory, to store access information to the non-volatile memory before accessing the non-volatile memory, and a memory controller to control a write pulse width to the non-volatile memory based on a free space of the storage or based on the access information stored in the storage.

18 Claims, 4 Drawing Sheets

CONTROLLING WRITE PULSE WIDTH TO NON-VOLATILE MEMORY BASED ON FREE SPACE OF A STORAGE

CROSS-REFERENCE TO RELATED APPLICATIONS

This application is based upon and claims the benefit of priority from the prior Japanese Patent Application No. 2016-183330, filed on Sep. 20, 2016, the entire contents of which are incorporated herein by reference.

FIELD

Embodiments relate to a memory system and a processor system.

BACKGROUND

A Processor to be used for a portable information terminal is required to consume low power. For this reason, it is considered to replace a cache memory, a main memory, etc. with a non-volatile memory. An MRAM (Magnetoresistive Random Access Memory) attracts attention because the MRAM satisfies all of three feature requirements of high rewrite durability, high-speed read and write performances, and highly integratable cell areas, among a variety of non-volatile memories. There are high expectations to the MRAM because the MRAM has a higher operation speed than other non-volatile memories when the MRAM is used as a cache, the MRAM has higher area efficiency than conventional memories, and a large-capacity high-speed cache can be built in a processor. Especially, among MRAMs, a perpendicular-magnetization spin transfer mode, referred to as an STT-MRAM (Spin Transfer Torque MRAM), is expected for a variety of applications because of an extremely-small read current, an extremely-short write delay, and a high-speed operation.

However, the MRAM has a problem of a higher write error probability than an SRAM and a DRAM. It is considered to perform a verification process to write data and then read and verify the data. However, the verification process takes time which lowers the access speed. It is also considered to raise a write voltage, which would however be a factor for increasing power consumption. It is further considered to lengthen a write pulse width, which also lowers the access speed.

DETAILED DESCRIPTION

According to one embodiment, a memory system has a non-volatile memory, a storage accessible at higher speed than the non-volatile memory, to store access information to the non-volatile memory before accessing the non-volatile memory, and a memory controller to control a write pulse width to the non-volatile memory based on a free space of the storage or based on the access information stored in the storage.

Figure 1:
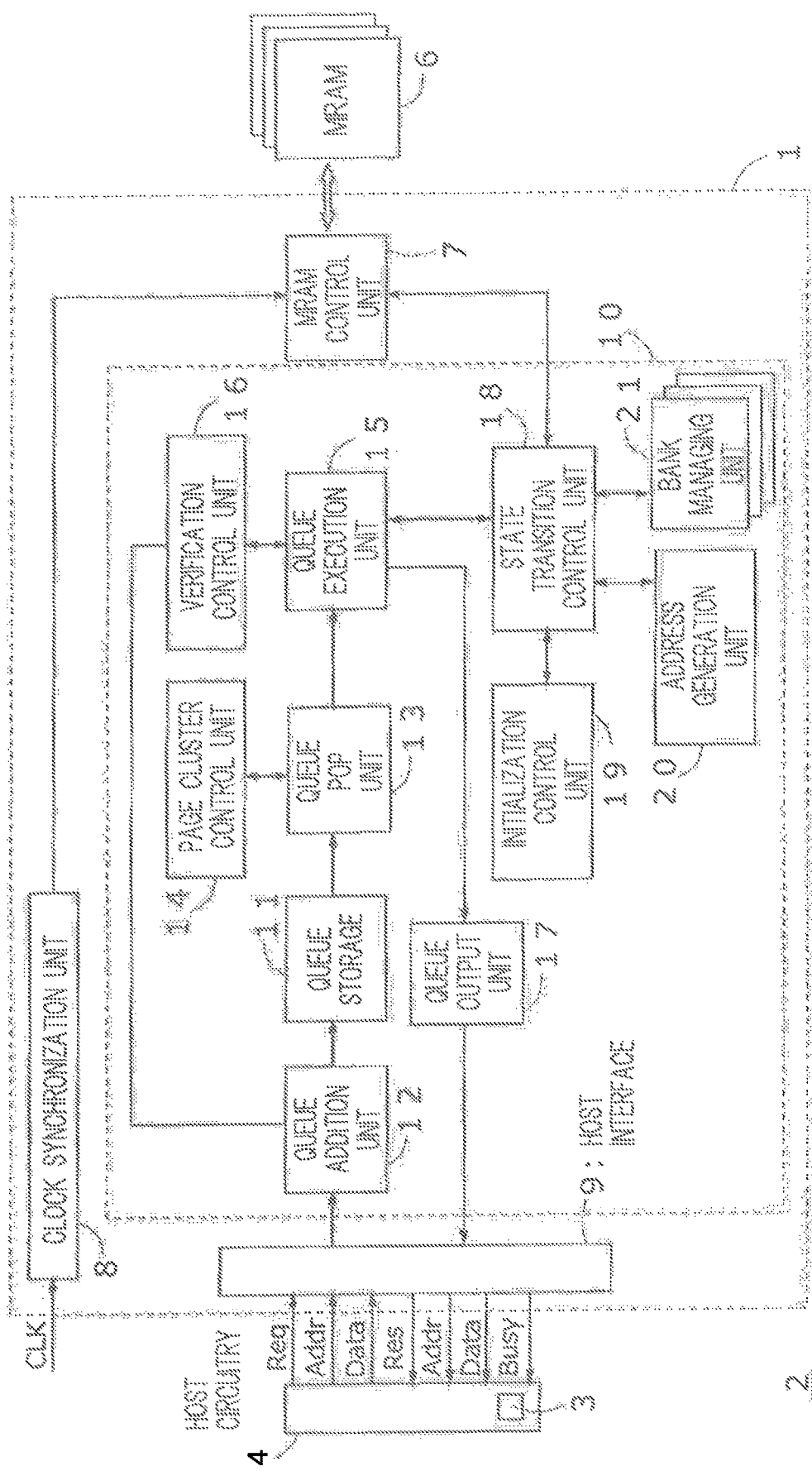
FIG. 1 is a block diagram schematically showing the configuration of a processor system provided with a memory system according to an embodiment.

An embodiment will now be explained with reference to the accompanying drawings. FIG. 1 is a block diagram schematically showing the configuration of a processor system 2 provided with a memory system 1 according to an embodiment. The processor system 2 of FIG. 1 is provided with host circuitry 4 including a processor 3, in addition to the memory system 1.

There is no limitation on the detailed internal configuration of the host circuitry 4. The processor 3 provided in the host circuitry 4 may be a single-core processor 3 or a multicore processor 3. The internal configuration of the host circuitry 4 is arbitrary. For example, in the host circuitry 4, one or multiple levels of cache memories may be provided. Moreover, in the host circuitry 4, an MMU (Memory Management Unit) that manages addresses issued by the processor 3, a page table or TLB (Translation Lookaside Buffer) for performing address conversion, etc. may be provided.

The memory system 1 has a memory controller 5 and an MRAM 6. The MRAM 6 in the memory system 1 may be an STT-MRAM for spin-injection writing using a perpendicular magnetization MTJ (Magnetic Tunnel Junction) or may be an MRAM 6 in another write mode.

The MRAM 6 of FIG. 1 may be a main memory to be accessed by the processor 3 or may be a cache memory having a higher access priority than the main memory. For example, when the processor 3 and a low-level cache memory are included in the host circuitry 4, the MRAM 6 of FIG. 1 may be a high-level cache memory.

The MRAM 6 of FIG. 1 may be replaced with a non-volatile memory such as a ReRAM. Moreover, when the MRAM 6 of FIG. 1 is used as a main memory, in addition to the MRAM 6 of FIG. 1, a volatile memory, such as a DRAM (Dynamic RAM), may be provided to form a hybrid main memory.

The memory controller 5 of FIG. 1 performs data write control and data read control to the MRAM 6 in response to an access request from the processor 3 in the host circuitry 4. The memory controller 5 of FIG. 1 has an MRAM control unit 7, a clock synchronization unit 8, a host interface 9, and a controller core 10.

The MRAM control unit 7 performs data write control and data read control to the MRAM 6. The clock synchronization unit 8 generates a signal in synchronism with an externally input clock signal CLK and feeds the signal to the MRAM control unit 7. With the signal, the MRAM control unit 7 performs data write control and data read control to the MRAM 6 in synchronism with the externally input clock signal CLK.

The host interface 9 sends and receives several kinds of signals to and from the host circuitry 4. The signals to be transmitted from the host circuitry 4 to the host interface 9 are, for example, a command, an address, and data. The command includes a write command and a read command. The signals to be transmitted from the host interface 9 to the host circuitry 4 are, for example, a command response signal, an address, data, and a busy signal.

The controller core 10 performs access control to the MRAM 6, together with the MRAM control unit 7. The controller core 10 has a queue storage (memory unit) 11, a queue addition unit 12, a queue pop unit 13, a page cluster control unit 14, a queue execution unit 15, a verification control unit 16, a queue output unit 17, a state transition control unit 18, an initialization control unit 19, an address generation unit 20, and a bank managing unit 21.

The queue storage 11 temporarily stores access information requested by the host circuitry 4 to the MRAM 6, before accessing the MRAM 6. In the following, each access information is referred to as a queue. Each queue includes a command, an address, and data.

The queue storage 11 can be configured with, for example, a register configured by D flip-flops or the like. Although having a small capacity, the queue storage 11 can write and read data at a higher speed than the MRAM 6.

When new access information is transmitted from the host circuitry 4, the queue addition unit 12 writes the new access information in the queue storage 11, as a new queue. Moreover, as described later, when a verification process to the MRAM 6 is performed later, the queue addition unit 12 receives a queue for the verification process from the MRAM control unit 7 and adds the queue to the queue storage 11.

The page cluster control unit 14 classifies queues in the storage 11 per page to generate per-page clusters and retrieves a queue per cluster. The queue pop unit 13 retrieves a queue to be executed next from the queue storage 11 and feeds the queue to the queue execution unit 15, under control by the page cluster control unit 14.

The queue execution unit 15 executes a command included in the queue retrieved from the queue storage 11 via the queue pop unit 13. If the command is a write command, as described later, a write mode is selected. The queue execution unit 15 selects a write mode per queue included in each of the clusters for which the queues in the queue storage 11 are classified per page.

As described later, in the present embodiment, there are a first mode and a second mode, as the write mode. The first mode is a mode for performing a verification process to read data that has been written in the MRAM 6 and to verify the read data, based on a free space of the queue storage 11 or a queue stored in the queue storage 11. The second mode is a mode to write data with a write pulse width longer than that of the first mode, without the verification process.

In more specifically, the queue execution unit 15 measures the number Nw of write commands in each cluster, the number Nr of read commands in each cluster, and the total number Nq of commands in each cluster. Then, the queue execution unit 15 selects the second mode in the case where Nq reaches the maximum number storable in the queue storage 11 or in the case of Nw>Nr, and selects the first mode in other cases.

The queue execution unit 15 may determine whether at least one read command follows a write command, instead of determining whether Nw>Nr or not. In this case, the first mode is selected when at least one read command follows the write command, and the second mode is selected when no read command follows the write command.

In the second mode, since a write pulse width is made longer than in the first mode, an error probability is considered to be low even if the verification process is not performed. Conversely, in the second mode, the write pulse width is made longer so that the error probability is lowered to the extent that there is no practical problem.

In the first mode, since the write pulse width is shorter than in the second mode, high-speed writing to the MRAM 6 is possible, however, the error probability may become higher if no measure is taken. For this reason, the verification process is performed after writing, and if a write error is detected through the verification process, writing is performed again. However, if the verification process is performed for each write command, the following queue cannot be quickly processed, so that the queue storage 11 becomes full. Especially, when a write command is followed by a read command, a read-command process timing is delayed if the verification process is performed in a write-command process, and hence the processing performance of the processor 3 is lowered. For this reason, in the present embodiment, and in the first mode, write commands in the same page are sequentially executed without verification processes, and when moving to the next page, the verification processes in the previous page are performed all together in this way, read commands in the same page can be quickly processed, so that access performance is prevented from being lowered.

When the queue execution unit 15 selects the first mode, the verification control unit 16 performs later the verification process for each write command. In a specific manner, the verification control unit 16 generates a queue for the verification process and sends the queue to the queue addition unit 12. The queue addition unit 12 additionally stores the queue for the verification process to the queue storage 11.

Based on a result of queue execution at the queue execution unit 15, the state transition control unit 18 generates several kinds of control signals for accessing the MRAM 6. The initialization control unit 19 initializes the controller core 10 at power on. Based on an address included in a queue, the address generation unit 20 generates an address for accessing the MRAM 6.

The bank managing unit 21 divides the MRAM 6 into a plurality of banks and performs access control to each bank. Each bank includes a plurality of pages. The bank managing unit 21 can select a page to be accessed for each bank.

Figures 2, 3, 4:
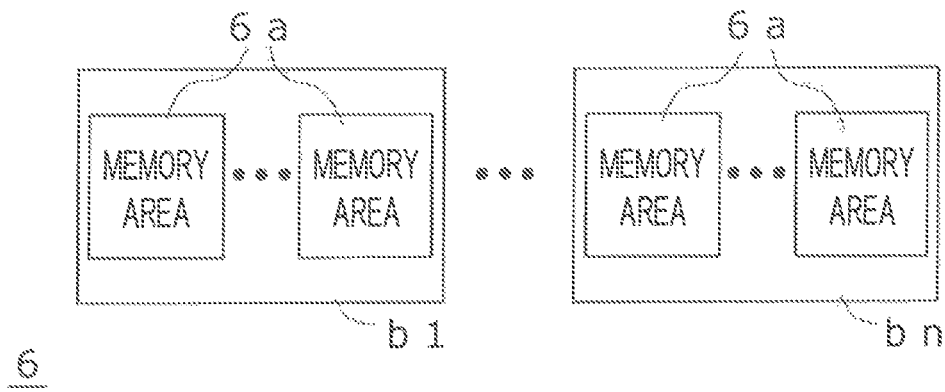
FIG. 2 is an illustration showing the configuration of an MRAM.
FIG. 3 is an illustration showing the configuration of a queue storage.
FIG. 4 is an illustration showing an example of clusters generated by a page cluster control unit.

FIG. 2 is an illustration showing the configuration of the MRAM 6. As shown in FIG. 2, the MRAM 6 is divided into a plurality of banks b1 to bn, each bank having a plurality of memory areas 6a. The memory areas 6a are associated with respective pages. There are different word lines to be driven for the respective memory areas 6a. A word line to be driven is decided by decoding an address included in access information from the processor 3. However, since a heavy load is applied to the word line, it takes time to drive the word line. For this reason, when accessing a memory area 6a associated with each page, it is preferable to sequentially perform a write process and a read process to the memory area 6a.

Moreover, when accessing a memory area 6a of a different page, it is required to perform a process to decode a new address to drive a new word line. Such a process is referred to as a page open process. A process to end access to a memory area 6a of a page is referred to as a close process. For example, when access is changed from access to a memory area 6a of a page A to access to a memory area 6a of a page B in the same bank, it is required to perform the open process to the page B after the close process to the page A. The number of pages that can be continuously put in an opened state in each bank is generally one page. Accordingly, in order to access a different page in the same bank, it is required to perform the close process to the opened page. This is because there is a limitation on the number of sense amplifier circuitry and of row buffer circuitry for storing read data, provided in each bank, and hence there is a limitation on the number of pages to be put in an opened state.

As described above, since the open process and the close process are required whenever changing pages, it is desirable that the number of times of page change is smaller as much as possible. For this reason, in the present embodiment, a plurality of clusters are generated. Each cluster has queues obtained by dividing the queues in the queue storage 11 per page, and access is made to the MRAM 6 per cluster.

FIG. 3 is an illustration showing the configuration of the queue storage 11. The queue storage 11, without divided per page, stores access information from the host circuitry 4 sequentially. Since the access information includes a command, an address, and data, the queue storage 11 is provided with areas for storing the three kinds of information. As described above, the queue storage 11 is configured with, for example, a register. However, the queue storage 11 may be configured with a high-speed memory such as an SRAM.

A process to divide queues in the queue storage 11 into clusters is performed by the page cluster control unit 14. FIG. 4 is an illustration showing an example of clusters generated by the page cluster control unit 14. Clusters A and B of FIG. 4 are associated with the pages A and B, respectively. The cluster A stores queue information to the page A. In more specifically, the clusters A and B store write and read commands to the pages A and B, respectively. The clusters A and B store access information in order issued by the processor 3 in the host circuitry 4.

The queue execution unit 15 executes access information in order from a command of the head access information in the cluster A. Before executing the head command, the queue execution unit 15 performs the open process to the page A that is associated with the cluster A.

The commands in the cluster A include write commands and read commands. In the case of the read commands, data corresponding to a specified address is read out in a predetermined processing procedure from the MRAM 6. In the case of the write commands, as described later, based on the free space of the queue storage 11 or a queue in the queue storage 11, the first or the second mode is selected to write data in the MRAM 6. For example, when the first mode is selected, all write commands in the cluster A are executed in order without the verification processes. The verification processes are performed all together after the completion of execution of the all write commands in the cluster A but before the start of process to the next cluster. The reason why the verification processes are performed before the start of process to the next cluster is as follows. If the process to the next cluster is to be performed to another page in the same bank as the page A, the close process to the page A is inevitably performed. When performing the verification process after the execution of the close process to the page A, the open process to the page A is required again, which lowers memory access efficiency. Therefore, it is efficient to perform the verification processes all together before the start of process to the next cluster.

In the case where there are read and write commands in a cluster, such as the cluster A of FIG. 4, the queue execution unit 15 executes the commands in order unchanged. In other words, the execution order of the read and write commands is not changed. If the commands are executed in a changed order, data inconsistency could occur. However, in the present embodiment, since the order of read and write commands is not changed, there is no such a problem of data inconsistency. In this way, the queue execution unit 15 performs an out-of-order process only for the verification processes that are to be performed later in the execution of write commands in the first mode.

In processing each cluster, as page open/close policies, there are an open page policy and a closed page policy. The open page policy is a policy to continuously open a once-opened page until accessing another page in the same bank as the opened page. In this policy, if what is accessed next is another page, it is required to perform the close process to the page which has been opened. On the other hand, if what is accessed next is the same opened page, since the page is continuously opened, the page open process can be omitted. The closed page policy is a policy to always close a page whenever access to the page is completed. If what is accessed next in the bank of the page to be closed is another page, since the close process can be performed in advance, the open process can be performed smoothly. However, the close and open processes have to be performed even if what is accessed next in the bank of the page to be closed is the page to be closed itself.

On completion of the execution of all commands in the cluster A of FIG. 4, the queue execution unit 15 subsequently starts the execution of commands in the cluster B. If the closed page policy is adopted to the MRAM 6 or if the page B of the cluster B is another page in the same bank as the page A of the cluster A, the close process is performed to the page A or the cluster A. If the page B of the cluster B is not an already opened page, in execution of the cluster B of FIG. 4, the open process is performed to the page B that is associated with the cluster B. The queue execution unit 15 performs execution in order from a command in the head access information of the cluster B. If the command to be executed is a write command, the first or the second mode is selected. For example, if there is no free space in a queue, the second mode is selected. If the second mode is selected, the queue execution unit 15 makes longer the write pulse width in execution of each write command in the cluster B.

Figure 5:
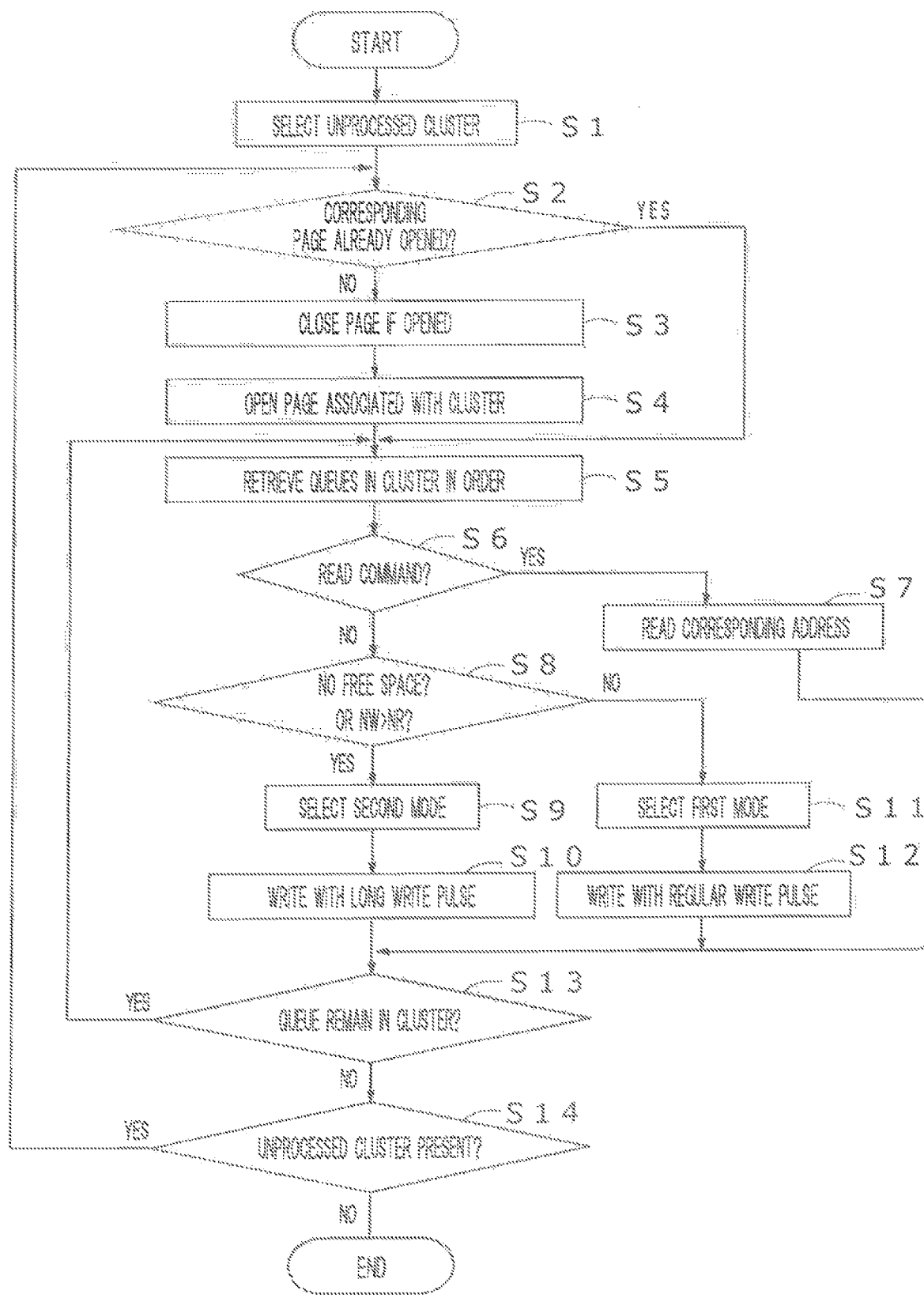
FIG. 5 is a flowchart showing an example of the operation of a controller core.
Figure 6:
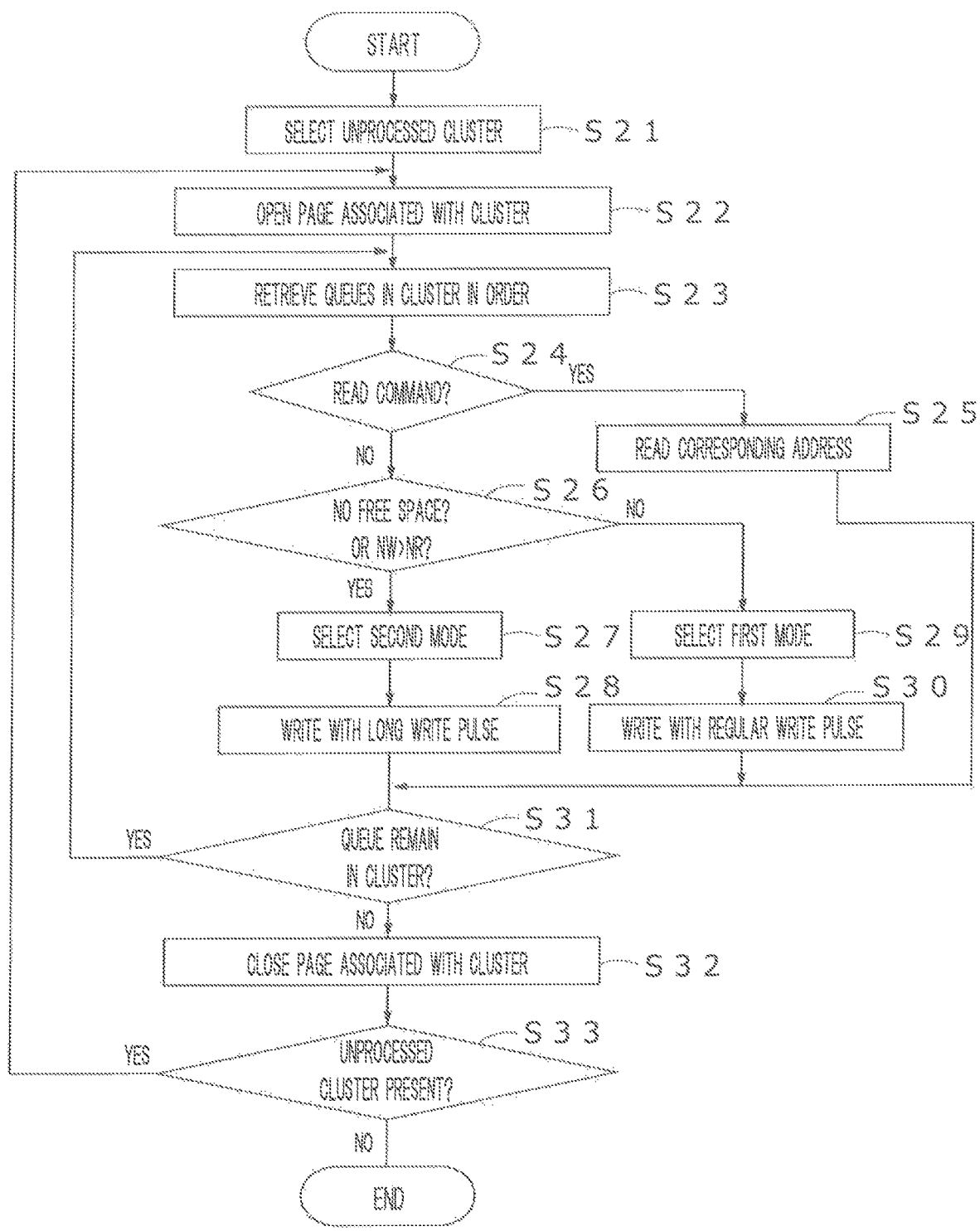
FIG. 6 is a flowchart showing an example of the operation of a controller core.

FIGS. 5 and 6 are flowcharts showing examples of the operation of the controller core 10. FIG. 5 is a flowchart in the case of adopting the open page policy. FIG. 6 is a flowchart in the case of adopting the closed page policy. The flowcharts of FIGS. 5 and 6 show the processes to be mainly performed by, in FIG. 1, the page cluster control unit 14, the queue execution unit 15, the verification control unit 16, and the state transition control unit 18. The page cluster control unit 14, the queue execution unit 15, the verification control unit 16, and the state transition control unit 18, which perform the processes of FIGS. 5 and 6, are included in a memory controller. The memory controller controls the write pulse width to the MRAM 6 based on the free space of the queue storage 11 or the access information stored in the queue storage 11. In other words, the memory controller controls the write pulse width to the MRAM 6 based on the free space of the queue storage 11 or the write and read commands stored in the queue storage 11.

The flowchart of FIG. 5 will be explained first. The queue execution unit 15 selects a cluster that is associated with an unprocessed page in the queue storage 11 (step S1). As described above, cluster generation is performed by the page cluster control unit 14. Subsequently, it is determined whether the corresponding page has already been opened (step S2). If the corresponding page is not opened yet, the currently opened page is closed (step S3).

Subsequently, the queue execution unit 15 opens a page that is associated with the selected cluster (step S4). Here, a word line of the memory area 6a that is associated with the corresponding page is driven via the MRAM control unit 7.

Subsequently, the queue execution unit 15 retrieves queues in the cluster in order from the head queue via the queue pop unit 13 (step S5). Subsequently, the queue execution unit 15 determines whether a command of each retrieved queue is a read command (step S6). If it is the read command, the corresponding address of the MRAM 6 is accessed via the MRAM control unit 7 to read the corresponding data (step S7).

If NO in step S6, it is determined that the command of the retrieved queue is a write command and it is determined whether the queue storage 11 has a free space (step S3). Or it may be determined in step S8 whether the number of write commands of each queue stored in the queue storage 11 is larger than the number of read commands of the queue. Or it may be determined in step S3 whether the write command of the queue retrieved in step S5 is followed by a read command.

If YES in step S8, the second mode is selected (step S9). Then, the state transition control unit 18 generates a write pulse having a write pulse width longer than a regular write pulse width to access the MRAM 6 via the MRAM control unit 7 to write data at an address specified by the queue retrieved in step S5 (step S10). In this case, since the write pulse width is long, data write reliability is considered to be high, and hence the verification process is omitted.

The pulse width of the write pulse generated in step S10 is a pulse width lengthened to the extent that the data write reliability is considered to be high enough without the verification process. Such a pulse width is found out in advance.

If NO in step S8, the first mode is selected (step S11). Then, the state transition control unit 18 generates a regular write pulse to access the MRAM 6 via the MRAM control unit 7 to write data at the address specified by the queue retrieved in step S5 (step S12).

If step S10 or S12 is complete, it is determined whether there is a queue remaining in the cluster (step S13). If there is a queue remaining (YES in step S13), step S5 and the following steps are repeated. If No in step S13, it is determined whether there is a cluster present, which is associated with an unprocessed page (step S14). If there is an unprocessed cluster present (YES in step S14), step S1 and the following steps are repeated. If there is no unprocessed cluster present (NO in step S14), the process of FIG. 5 ends.

The flowchart of FIG. 6 will be explained next. Firstly, an unprocessed cluster is selected (step S21). Subsequently, a page associated with the selected cluster is opened (step S22). In the case of the closed page policy, even if access to the same page in the same bank continues, the close process is performed to the page whenever each access is complete. Therefore, whenever starting new access, the open process to the page is required.

Since the following steps S23 to S31 are the same as steps S5 to S13 of FIG. 5, the explanation of those steps is omitted. If it is determined in step S31 that there is no queue remaining in the cluster, a page that has been opened is closed (step S32). As described above, the process of FIG. 6 is different from that of FIG. 5 in that, in FIG. 6, a page is closed whenever the process of each cluster ends. Thereafter, it is determined whether there is an unprocessed cluster present (step S33), and if there is, step S22 and the flowing steps are repeated, whereas if not, the process of FIG. 6 ends.

As described above, in the present embodiment, in accessing a non-volatile memory such as the MRAM 6, the write pulse width to the MRAM 6 is controlled based on the free space of the queue storage 11 or the queues stored in the queue storage 11. In more specifically, when there is no free space in the queue storage 11 or the number of write commands stored in the queue storage 11 is larger than the number of read commands stored in the queue storage 11, the pulse width of a write pulse to the non-volatile memory is made longer than a regular pulse width. In this way, even though the verification process is not performed, there is no possibility of high error probability. Moreover, since the verification process is not required, generation of queues unstorable in the queue storage 11 is prevented.

Moreover, in the present embodiment, if a write command is not followed by a read command, the pulse width of the write pulse is lengthened, so that the verification process is not required, whereas if a write command is followed by a read command, data writing in the same page is performed sequentially with no verification processes and then the verification processes are performed all together when the page is closed. In this way, it is possible to speed-up a read command execution timing and to improve access performance of the processor 3 to the non-volatile memory.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A memory system comprising:
   a non-volatile memory;
   a storage accessible at higher speed than the non-volatile memory, to store access information that includes information of whether or not to perform writing or reading to the non-volatile memory, the information including at least one of a write command and a read command; and
   a memory controller to select either one of a first mode and a second mode based on a free space of the storage or based on the write and read commands stored in the storage, the first mode being a mode to write data in the non-volatile memory with a first write pulse width, and then perform a verification process to read and inspect the written data, and the second mode being a mode to write data, without the verification process, with a second write pulse width longer than the first write pulse width in the first mode.

2. The memory system of claim 1, wherein the access information stored in the storage comprises a command that is issued by a processor and is used to access the non-volatile memory, an address to be accessed, and data.

3. The memory system of claim 1, wherein the memory controller selects the second mode when the storage has no free space or there is no read command to be executed after a write command stored in the storage.

4. The memory system of claim 1, wherein the non-volatile memory comprises a plurality of memory areas,
   wherein the storage stores the access information in association with a memory area to be accessed among the plurality of memory areas.

5. The memory system of claim 4, wherein the memory controller processes access information to one memory area stored in the storage and then processes in order access information stored in the storage to other memory areas.

6. The memory system of claim 4, wherein the memory controller selects the first or the second mode for a memory area to be accessed.

7. The memory system of claim 6, wherein, when selecting the first mode, the memory controller writes data sequentially in one memory area to be written and, after completion of access to the one memory area and before starting access to another memory area, the memory controller performs a verification process to the data written in the one memory area.

8. The memory system of claim 6, wherein, when read and write commands are included in access information to one memory area, the access information being stored in the storage, the memory controller performs a write process and a read process to the one memory area in order of the read and write commands stored in the storage.

9. The memory system of claim 1, wherein the storage comprises a volatile memory.

10. The memory system of claim 1, wherein the non-volatile memory comprises an MRAM (Magnetoresistive Random Access Memory).

11. A processor system comprising:
a processor;
a non-volatile memory accessed by the processor;
a storage accessible at higher speed than the non-volatile memory, to store access information that includes information of whether or not to perform writing or reading to the non-volatile memory, the information including at least one of a write command and a read command; and
a memory controller to select either one of a first mode and a second mode based on a free space of the storage or based on the write and read commands stored in the storage, the first mode being a mode to write data in the non-volatile memory with a first write pulse width, and then perform a verification process to read and inspect the written data, and the second mode being a mode to write data, without the verification process, with a second write pulse width longer than the first write pulse width in the first mode.

12. The processor system of claim 11, wherein the access information stored in the storage comprises a command that is issued by a processor and is used to access the non-volatile memory, an address to be accessed, and data.

13. The processor system of claim 11, wherein the memory controller selects the second mode when the storage has no free space or there is no read command to be executed after a write command stored in the storage.

14. The processor system of claim 11, wherein the non-volatile memory comprises a plurality of memory areas,
wherein the storage stores the access information in association with a memory area to be accessed among the plurality of memory areas.

15. The processor system of claim 14, wherein the memory controller processes access information to one memory area stored in the storage and then processes in order access information stored in the storage to other memory areas.

16. The processor system of claim 14, wherein the memory controller selects the first or the second mode for a memory area to be accessed.

17. The processor system of claim 14, wherein the memory controller is configured to select the first and the second mode based on the write and read commands stored in the storage.

18. The memory system of claim 1, wherein the memory controller is configured to select the first and the second mode based on the write and read commands stored in the storage.

* * * * *